United States Patent
Lee et al.

(10) Patent No.: US 8,366,831 B2
(45) Date of Patent: Feb. 5, 2013

(54) EVAPORATION SOURCE

(75) Inventors: Jong-Woo Lee, Suwon-si (KR);
Tae-Seung Kim, Suwon-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 592 days.

(21) Appl. No.: 12/654,044

(22) Filed: Dec. 8, 2009

(65) Prior Publication Data
US 2010/0139564 A1 Jun. 10, 2010

(30) Foreign Application Priority Data
Dec. 10, 2008 (KR) .................. 10-2008-0125094

(51) Int. Cl.
*C23C 16/00* (2006.01)
(52) U.S. Cl. ........................ 118/726; 118/727
(58) Field of Classification Search ............ 118/726, 118/727
See application file for complete search history.

(56) References Cited

U.S. PATENT DOCUMENTS

| 2005/0072357 | A1* | 4/2005 | Shero et al. ............ 118/715 |
| 2007/0204798 | A1* | 9/2007 | Iwasaki et al. ........... 118/726 |

FOREIGN PATENT DOCUMENTS

| JP | 02030754 | 2/1990 |
| JP | 03107452 | 5/1991 |
| JP | 05139882 | 6/1993 |
| JP | 2005082872 | 3/2005 |
| KR | 20-0342433 | 2/2004 |
| KR | 10-2005-0029793 | 3/2005 |
| KR | 10-0684739 | 2/2007 |

OTHER PUBLICATIONS

Korean Office Action issued by KIPO, dated Jan. 13, 2011, corresponding to Korean Patent Application No. 10-2008-0125094, together with Request for entry.

* cited by examiner

*Primary Examiner* — Keath Chen
(74) *Attorney, Agent, or Firm* — Robert E. Bushnell, Esq.

(57) ABSTRACT

The present invention relates to an evaporation source used in a vacuum deposition apparatus for forming an organic film or a metal film. The present invention provides an evaporation source including: a crucible accommodating a deposition material and having an opening portion through which the deposition material passes; a mesh member installed in the opening portion of the crucible and having a plurality of holes; and thermally conductive balls coated on the mesh member. Here, the thermally conductive balls are provided to cover the deposition material having a predetermined interval with the deposition material, not being mixed with the deposition material filling the crucible.

15 Claims, 5 Drawing Sheets

EVAPORATION SOURCE

CLAIM OF PRIORITY

This application makes reference to, incorporates the same herein, and claims all benefits accruing under 35 U.S.C. §119 from an application earlier filed in the Korean Intellectual Property Office on 10 Dec. 2008 and there duly assigned Serial No. 10-2008-0125094.

BACKGROUND OF THE INVENTION

1. Field of the Invention

The present invention relates to an evaporation source used in a vacuum deposition apparatus for forming an organic layer or a conductive layer.

2. Discussion of Related Art

An organic light emitting display device has a principle of emitting light by itself as a proper energy difference is generated in an organic thin film of a glass substrate when voltage is applied between an anode and a cathode, the glass substrate being coated with an anode layer, the organic thin film, and a cathode layer. In other words, an energy remaining when injected electrons and holes are re-combined is generated as light.

An Indum Tin Oxide (ITO) film having a small surface resistance and excellent transmittance may be used as the anode layer of the organic light emitting device. In order to enhance light emitting efficiency, a multi-layer structure of a hole injection layer (HIL), a hole transport layer (HTL), an emitting layer (EML), an electron transport layer (ETL), and an electron injection layer (EIL) may be used as the organic thin film, and a metal film such as a LiF-Al etc. may be used as the cathode layer. The organic material used in the organic thin film is Alq3, TPD, PBD, m-MTDATA, TCTA, etc., and a dopant is cumarine6, BczVBi etc.

The organic light emitting display device using the organic light emitting device has excellent features in view of a rapid response speed, a low power consumption, a high brightness, etc. and is further able to be made super light weight and super thin so that it has been spotlighted as a next generation display. However, mass-production equipment for the organic light emitting device has not been yet standardized so that there is an acute demand for development of the proper mass-production equipment.

The mass-production process of the organic light emitting device may be largely divided into three parts, a pre-process, a post-process and an encapsulation process. The pre-process is a process of forming an ITO thin film on a glass substrate mainly using a sputtering technique, and a mass-production process thereof has been already commercialized for a liquid crystal display apparatus. The encapsulation process is a sealing process of a device in order to improve a life time of the device, since the organic thin film is very vulnerable to the moisture and oxygen in the air. The post-process is a process of forming the organic thin film and the metal thin film on the substrate using an evaporation method in a high vacuum state. In the post-process, a vacuum deposition method forming a pixel patterning using a shadow mask on the substrate by evaporating organic material under a high vacuum atmosphere is mainly used.

As indispensable factors in mass-production of the organic light emitting device, it is very important how a high speed deposition is realized, maintaining a high vacuum during the post-process, and the detailed matters thereof are as follows:

First, in order to minimize reciprocal pollution between the multi-layer organic thin films, several independent chambers should be used and a large-area substrate of 370×470 nm or more should be utilizable. At this time, the dropping of the substrate and the dropping of the metal mask by means of thermal expansion should be maximally suppressed. Second, the alignment of the mask should be rapid and an in-situ of the mask covered with a film should be cleanable. Third, a TACT time of two minutes or less (time rendered in outputting a next sheet thereof after a sheet of substrate is output) should be realized by making the transfer of the substrate between chambers fast. Fourth, an evaporation source guaranteeing uniformity of the organic thin film that is most effective on the characteristics of the organic light emitting device to be below ±5%, and a deposition process should be realizable. At this time, it takes a lot of time for the high vacuum equipment to break vacuum to be restored again so that one time use capacity of the evaporation source should be maximized so that the vacuum of the high vacuum equipment can be maintained as long as possible for a smooth mass-production. In other words, the supply frequency of the exhausted organic material or metal material should be minimized.

As the evaporation source, an apparatus using a face-down deposition method that deposition material is put into a crucible to be heated and the material is evaporated into the substrate positioned in the upper to be deposited is mainly used. However, in the aforementioned evaporation source, heat loss occurs in the upper of the crucible by means of the opening portion of the upper of the crucible. Accordingly, as the deposition material evaporated from the internal of the crucible to move to a film forming substrate is condensed around the opening portion by means of the abrupt temperature change between the inner side and the outer side of the opening portion, a phenomenon that the opening portion is clogged may occur. If the opening portion is clogged, it may cause a problem that evaporation rates of the deposition process become unstable.

Also, when melting deposition material is used in the evaporation source, the deposition material is melted by the heat inside the crucible and portions of the deposition material may be splashed to the upper of the crucible from the evaporation surface of the deposition material. At this time, portions of the deposition material may be fixed around the opening portion of the upper of the evaporation source. In that case, as the opening portion is clogged with the deposition material, the evaporation rates of the deposition material become unstable so that it may cause a problem that it is difficult to secure reproducibility of a film thickness formed on the substrate.

Furthermore, if the interval between the evaporation source and the substrate is reduced to 100 mm or less when the organic material or the metal material is deposited on the large-area substrate, the deposition efficiency may be increased. However, heat generated in the evaporation source may cause thermal damage to the organic thin film and the shadow mask or bring drooping of the substrate. Such problems may be more serious in the case of a multi-point evaporation source or a linear evaporation source in which heat is generated from a large area than a point evaporation source. For example, in the case of a soda-lime glass having a thermal expansion coefficient of about 10 ppm, when a temperature rises to 25° C., expansion of about 250 μm occurs from glass of 1 m. In this case, a precision patterning of a pixel is impossible. Also, even in the case of EAGLE 2000 substrate (product of Samsung Corning Precision Glass) having relatively low thermal expansion coefficient of about 3.2 ppm, expansion of about 8 μm occurs under the same condition.

As described above, for mass-production of the organic light emitting display device, there is a demand for an evaporation source that can maximally block heat transferred to the shadow mask or the substrate side, increase one time receiving capacity of the deposition material, and be suitable for a rapid deposition process, while equalizing the thickness of the deposited film.

SUMMARY OF THE INVENTION

Therefore, it is an object of the present invention to provide an evaporation source in which an upper opening portion is prevented from being clogged by blocking splashes of a deposition material.

It is another object of the present invention to provide an evaporation source capable of maximally blocking heat transferred to a shadow mask or a substrate.

It is another object of the present invention to provide an evaporation source that is suitable for mass-production by increasing one time receiving capacity of the deposition material.

In order to accomplish the above object, according to one aspect of the present invention, there is provided an evaporation source including: a crucible accommodating a deposition material and having an opening portion through which the deposition material passes; a mesh member installed in the opening portion of the crucible and having a plurality of holes; and thermally conductive balls coated on the mesh member. Here, the thermally conductive balls are installed to cover the deposition material having a predetermined interval with the deposition material, not being mixed with the deposition material filling the crucible.

Preferably, the diameter of the thermally conductive ball is in the range of 0.5 mm to 5.0 mm. Also, the thermally conductive ball includes material having a melting point of 700° C. or more and having no outgasing at 500° C. The thermally conductive ball may include a SiC polymer.

Each cell of the mesh member has a diameter smaller than the thermally conductive balls. Also, the mesh member may include a barrier extending outwards along an inner wall of the crucible and holding the thermally conductive balls stacked in a multi-layer. The mesh member may include any one material of stainless steal, cooper and a combination thereof.

The evaporation source may further comprise supporters supporting the mesh member in the inner walls on the upper sides of the crucible. The supporters may be integrally provided with the mesh member and may be separable together with the mesh member from the crucible. In that case, the crucible may include seating parts to which the supporters are coupled on the upper sides of the inner walls thereof. On the other hand, the supporters may be integrally provided with the crucible and may include protruding parts protruded from the inner wall of the crucible and contacting the mesh member.

The evaporation source may further include a cover covering the mesh member and the thermally conductive balls, coupled to the crucible and having another opening portion. The size of another opening portion is smaller than that of the opening portion of the crucible. The deposition material includes a meltable deposition material which is changed from a solid to a gas via a liquid.

The evaporation source may further comprise another thermally conductive balls mixed with the deposition material to be inserted into an inner space of the crucible.

The crucible has straight-shape side walls of which a lower side and an upper side of the inner space are the same in the cross-sectional area. With the present invention, the deposition material is fully filled in the crucible, making it possible to increase one time receiving capacity. Also, the upper of the deposition material is covered with the thermally conductive balls separated from the deposition material, making it possible to block heat transferred directly to the shadow mask or the substrate side from the crucible and to prevent the opening portion on the upper of the evaporation source from being clogged by the splash of the melt deposition material. Therefore, the evaporation source suitable for the mass production line for the rapid tact time and the mass production can be provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, exemplary embodiments according to the present invention will be described in detail with reference to the accompanying drawings so that those skilled in the art to which the present invention pertains can easily carry out the present invention.

Figure 1:
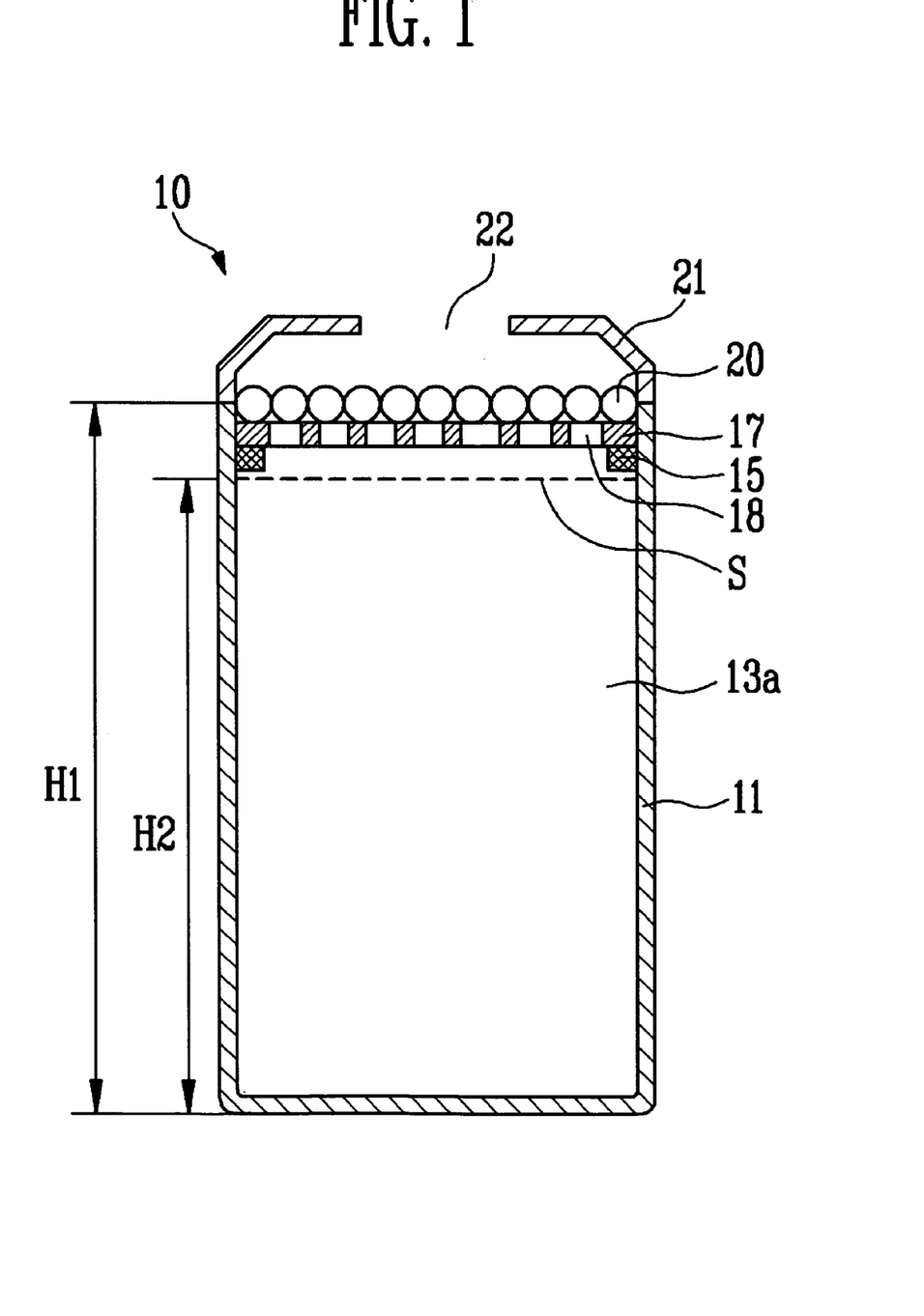
FIG. 1 is a cross-section of an evaporation source according to an embodiment of the present invention.
Figure 2:
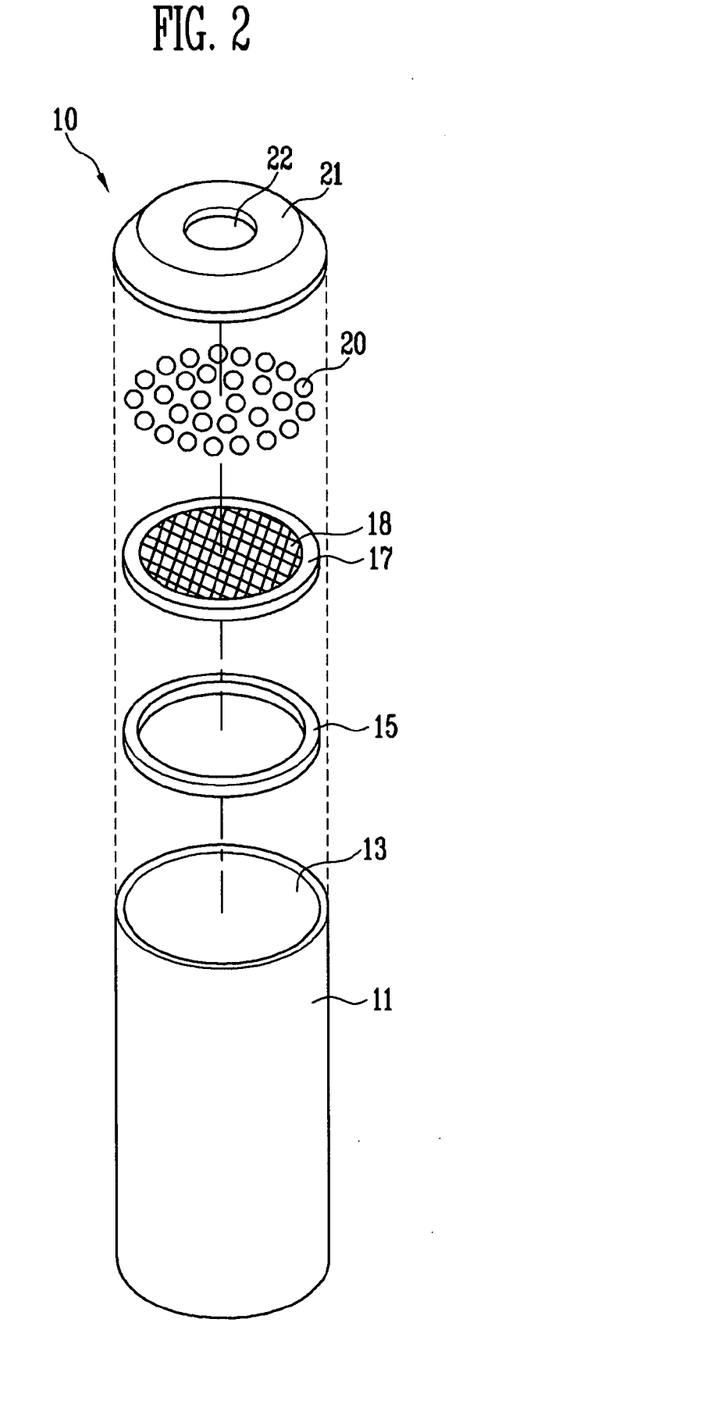
FIG. 2 is an exploded perspective view of an evaporation source according to an embodiment of the present invention.

FIG. 1 is a cross-section of an evaporation source according to an embodiment of the present invention, and FIG. 2 is an exploded perspective view of an evaporation source according to an embodiment of the present invention.

Referring to FIG. 1, the evaporation source 10 of the present embodiment includes a crucible 11, a mesh member 17, and thermally conductive balls 20. The crucible 11 includes an inner space 13a having a capacity of 100 cc or more to accommodate a deposition material and an opening portion 13 on the upper thereof.

The crucible 11 of the present embodiment has a straight shape wall (side wall) structure of which the cross-sectional areas of a lower side and an upper side of the inner space 13a are substantially equal. The crucible 11 having such a straight shape side wall holds more a deposition material in the inner space 13a than any other-shaped ones. The cross-section of the crucible 11 may have various shapes such as a circle, an oval, a quadrangle, a rectangle and a polygon.

The mesh member 17 serves to support the thermally conductive balls 20 and separate the deposition material filled in the inner space 13a of the crucible 11 from the thermally conductive balls 20. The mesh member 17 has a plurality of holes 18. The respective holes 18 form cells of the mesh member 17. The cell has a diameter smaller than the thermally conductive balls 20 so that the thermally conductive balls 20 cannot easily pass through the cell. The mesh member 17 may be formed in a plate shape having the plurality of holes 18 made of any one of stainless steel, copper and a combination thereof.

In order to uniformly maintain a temperature distribution inside the crucible 11, prevent a defect generated due to deposition organic material attached to the substrate or mask by the splash of the deposition material, and prevent an opening portion 22 (hereinafter, referred to as a second opening portion) of the evaporation source 10 from being clogged, the thermally conductive balls 20 are coated on the mesh member 17 to cover the deposition material at a predetermined interval.

Also, the thermally conductive balls 20 allows the heat of the crucible 11 not to be discharged into the substrate side directly through the second opening portion 22. In other words, the thermally conductive balls 20 prevent the film forming substrate from being dropped by the heat of the crucible 11 or prevent other organic film or shadow mask on the substrate from being damaged.

The thermally conductive balls 20 is made of material having a melting point higher than an operation temperature of the evaporation source 10 and not generating at least outgasing in a heating temperature region of the evaporation source 10. For example, when the operation temperature of the evaporation source 10 is in the range of 200° C. to 500° C., the thermally conductive balls 20 may be made of material having a melting point of about 700° C. higher than 500° C. and not generating outgasing at least at temperature of about 500° C. Here, the meting point of 700° C. or more is given to have a room for preventing being easily deformed or melted under a temperature atmosphere of about 500° C.

As the material for the thermally conductive balls 20, SiC-based polymer or ceramics having high heat-resistance and corrosion-resistance may be used. The SiC-based polymer means polymer whose main chain is made of a single bond of silicon (Si) and carbon (C). The SiC polymer may be obtained by performing a thermal deformation on silane polymer {(—Si(R)R'—)n} under Ar atmosphere at temperature of about 300° C., by initiating a ring opening polymerization of a ring-shaped carbosilane oligodimer or by performing a reductive coupling of R2SiCl2 and R2CCl2 using magnesium (Mg). After being synthesized, the SiC polymer forms SiC ceramics through a pyrolysis process, and at this time the generated SiC fiber is stable at a high temperature of 1000° C. or more and is excellent in view of tensile strength and elasticity. The thermally conductive balls in the present embodiment can be formed as the SiC fiber.

A cover 21 is installed to uniformly control an internal temperature of the crucible 11, that is, temperature in the upper and lower of the crucible 11, and secure reproducibility of the film thickness formed on the film forming substrate. The cover 21 has a second opening portion 22 having size smaller than that of the opening portion 13 on the upper side of the crucible. The cover 21 may be made of the same material as the crucible 11.

The crucible 11 of the present embodiment may be used in plural for forming a multi-point evaporation source or may be mounted on an evaporation source boat to move in a desired direction for forming a linear evaporation source. In the deposition apparatus, the substrate may, of course, be implemented to be scanned on the evaporation source using a moving means such as a shuttle, not moving the evaporation source.

A manufacturing method of the evaporation source 10 of the present invention will be described.

First, the crucible 11 made of graphite or quartz and having a straight shape side wall is prepared. Supporters 15 are installed around the opening portion 13 of the crucible 11, that is, on the inner wall of the upper side of the crucible 11. The supporters 15 support the mesh member 17 so that the mesh member 17 is not tilted. In the present embodiment, the supporters 15 are prepared in a hook shape using a separate member and then are attached to the inner walls of the crucible 11. The supporters 15 may be made of substantially the same material as the mesh member 17.

Then, the mesh member 17 is installed on the supporters 15. In the present embodiment, the mesh member 17 is installed on a position slightly indented towards the inner space 13a of the crucible 11 around the opening portion 13 of the crucible 11.

Next, the thermally conductive balls 20 are disposed on the mesh member 17. In this case, the thermally conductive balls 20 may be limited onto the mesh member by means of the upper end of the crucible 11 surrounding the edges of the mesh member 17 and protruded onto one surface of the mesh member 17 on which the thermally conductive balls 20 are put. The thermally conductive balls 20 cover the upper of the deposition material, not being mixed with the deposition material.

Next, the cover 21 is installed on the crucible 11 so that the thermaballs 20 are covered. Portions of the thermally conductive balls 20 may be exposed to the external through the second opening portion 22 of the cover 21.

With the evaporation source 10 as described above, the deposition process may be performed by filling the deposition material up to an upper end S of the inner space 13a of the crucible 11, that is, a height H2 very close to a height H1 of the crucible 11. Also, the deposition material fully filled in the crucible 11 during the deposition process is splashed to the second opening portion 22 of the cover 21 not to be attached and fixed to the second opening portion 22. That is, it is possible to prevent the melt deposition material from being stacked around the second opening portion 22 of the cover 21 through dam effects of the thermally conductive balls 20.

Figure 3:
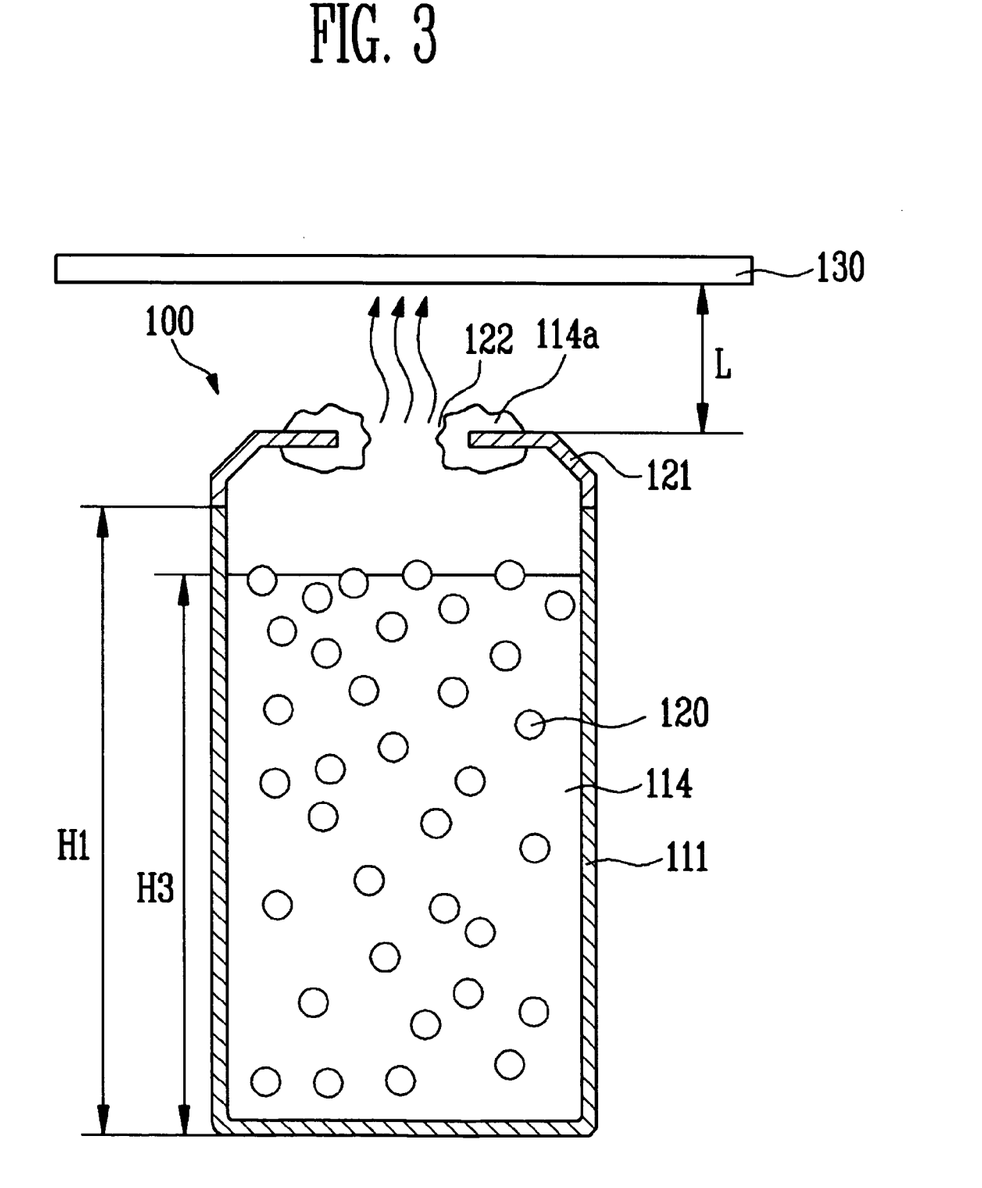
FIG. 3 is a cross-sectional view of an evaporation source of a comparative example.

FIG. 3 is a cross-sectional view of an evaporation source of a comparative example.

The comparative example is optionally designed in order to more clearly explain the features of the evaporation source of the present invention. Referring to FIG. 3, with the evaporation source 100 of the comparative example, the melt deposition material 114 mixed with the thermally conductive balls 20 is filled in the inner space of the crucible 111 at a predetermined height H3. If the evaporation source 100 is installed inside the vacuum chamber and is operated, the edges of the opening portions 122 of the cover 121 is clogged by portions of the melt deposition material 114a splashed from the inside of the crucible 111. If this state is continued, the opening portion 122 of the cover 121 is mostly clogged to make deposition speed or deposition rates unstable.

Furthermore, in the comparative example, heat generated from the crucible 111 is transferred directly to the substrate 130 side so that it may cause the dropping of the shadow mask or the substrate 130 or the damage of other organic film on the substrate. In particular, when the interval L between the crucible 111 and the substrate 130 is small as being about 100 mm, the problems as described above may be more serious.

Meanwhile, in order to prevent the generation of the problem due to the splash of the melt material, a separate inner plate may be installed in the crucible 111. However, when the inner plate is installed, the deposition material cannot be fully filled in the crucible 111, having a disadvantage that the continuous operating time is limited. Furthermore, the inner plate has an assembly shape in order to hold the deposition materials so that a profile of the organic deposition beam may be changed whenever the deposition material is charged and used again. In other words, the producibility of the deposited film may be defective.

As described above, although the evaporation source 100 of the comparative example has the aforementioned problems, the evaporation source 10 of the present embodiment described with reference to FIGS. 1 and 2 does not have such problems, having an advantage that it is suitable for a mass production line for a rapid tact time and a mass production.

Figure 4:
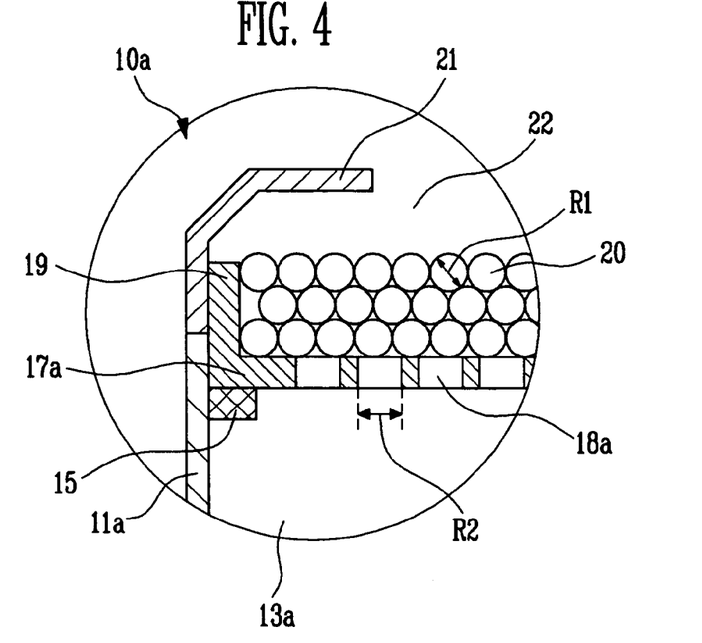
FIG. 4 is a partial enlarged view of an evaporation source of an embodiment of the present invention.

FIG. 4 is a partial enlarged view of an evaporation source of another embodiment of the present invention.

Referring to FIG. 4, with the evaporation source 10a of the present invention, a mesh member 17a has a barrier 19 for surrounding thermally conductive balls 20 in multi-layer put thereon. The barrier 19 is protruded on a crucible 11a at a predetermined height when the mesh member 17a is put on a supporter 15 fixed on an inner wall of an upper side of the crucible 11a. The thermally conductive balls 20 may be stacked on one surface of the mesh member 17a in about three to five layers.

The diameter of the thermally conductive ball 20 may be optionally selected in the range of about 0.5 mm to 5.0 mm. Under 0.5 mm, when the thermally conductive balls 20 are put on the mesh member 17a, the smooth discharge of gas-phase organic material generated in the crucible 11a may be hindered. Over 0.5 mm, portions of a meltable deposition material are splashed to be fixed to the space between the mesh member 17a and the thermally conductive balls 20, and accordingly a phenomenon that holes 18a of the mesh member 17a are clogged may be generated.

Meanwhile, the diameter of the thermally conductive ball 20 is selected from the range from about 0.5 mm to about 5.0 mm, making it possible to minimize that portions of melt deposition material are fixed to the space between the mesh member 17a and the thermally conductive balls 20, while smoothing the flow of the organic deposition beam. Furthermore, even when the melt material is splashed to be attached to one surface of the lower side of the mesh member 17a during the deposition process, the material flows down again to the inner space or vaporizes by the inner temperature of the crucible 11a to be discharged into the external, passing through spaces among the thermally conductive balls 20.

The size of each hole 18a of the mesh member 17a, i.e., each cell, is the size of the thermally conductive ball 20, a smaller size than a cross-section, or the cross-section in order to support the thermally conductive ball 20 and not to allow the thermally conductive ball 20 to be escaped to the inner space 13a of the crucible 11a. For example, diameter R2 of each cell of the mesh member 17a is smaller than diameter R1 of the thermally conductive ball 20.

Figure 5:
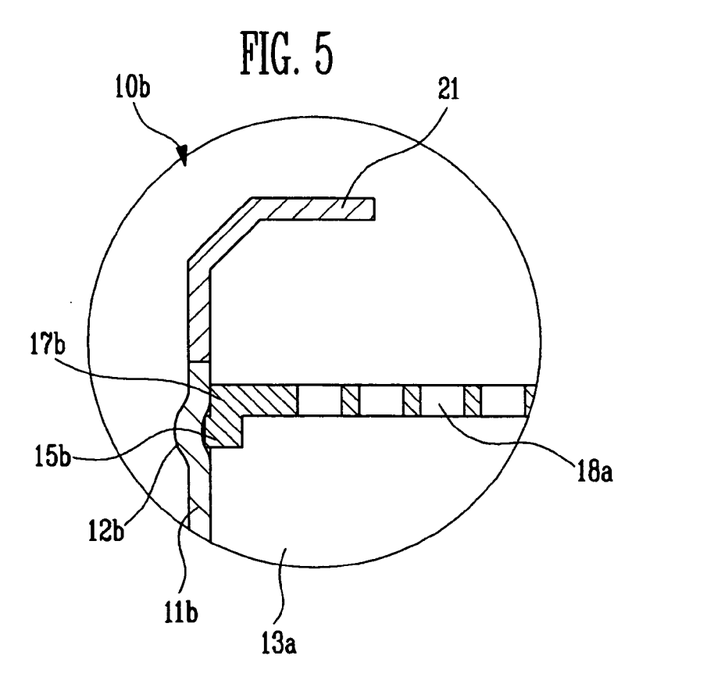
FIG. 5 is a partial enlarged view of an evaporation source of an embodiment of the present invention.

FIG. 5 is a partial enlarged view of an evaporation source of another embodiment of the present invention.

Referring to FIG. 5, with the evaporation source 10b of the present embodiment, a supporter 15b is integrally provided with the edge of a mesh member 17b. The supporter 15b is integrally coupled to one surface of a lower side on the edge of the mesh member 17b and is slightly protruded outwards from the edge. For convenience of explanation, thermally conductive balls are omitted in the present embodiment.

An unevenness 12b into which the supporter 15b is inserted is provided on the upper side of the crucible 11b. The unevenness 12b is formed to allow an inner side of the crucible 11b to be slightly indented and to allow an outer side of the crucible 11b to be slightly protruded from the inner side to the outer side. Of course, the outer side of the crucible 11b may be formed to be flat, not being protruded outwards.

When the mesh member 15b is coupled to the crucible 11b, the supporter 15b and the first unevenness 12b are engaged with each other to allow the mesh member 15b to be fixed around the opening portion on the upper side of the crucible 11b.

Figure 6:
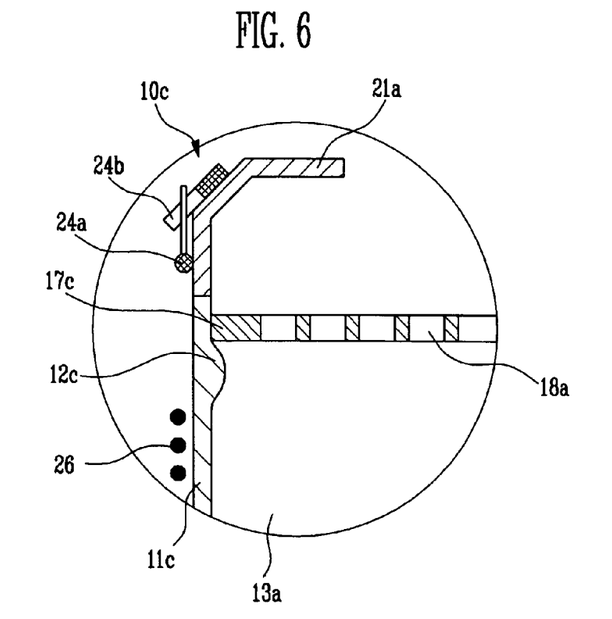
FIG. 6 is a partial enlarged view of an evaporation source of an embodiment of the present invention.

FIG. 6 is a partial enlarged view of an evaporation source of another embodiment of the present invention.

Referring to FIG. 6, with the evaporation source 10c of the present embodiment, a supporter 12c in an inner unevenness shape is integrally provided with a crucible 11c. In order to support the edges of the mesh member 17, the supporter 12c is formed to allow the inner side of the crucible 11c to be slightly bulged and protruded. For convenience of explanation, thermally conductive balls are omitted in the present embodiment.

When the mesh member 17c is coupled to the crucible 11c, the supporter 12c allows the mesh member 157c to be fixed in a desired horizontal state around the opening portion on the upper side of the crucible 11c.

Also, the evaporation source 10c of the present embodiment may include a first fixture 24a attached to the crucible 11c and a second fixture 24b attached to a cover 21a. The first texture 24a and the second texture 24b are used to firmly fix and couple the cover 21a to the crucible 11c. Of course, the first fixture 24a and the second fixture 24b may be applied to other crucible apparatuses 10, 10a and 10b of the aforementioned embodiments.

Also, the evaporation source 10c of the present embodiment may include a heater 26 coupled to the crucible 11c to supply heat to the crucible 11c. The heater 26 may include a first heater disposed on the upper side of the crucible 11c and a second heater disposed on the lower side of the crucible 11c. Meanwhile, although the heater is omitted in the evaporation sources 10, 10a and 10b of the aforementioned present embodiments for convenience of explanation, it will be obvious that a proper heater may be provided in each evaporation source.

Figure 7:
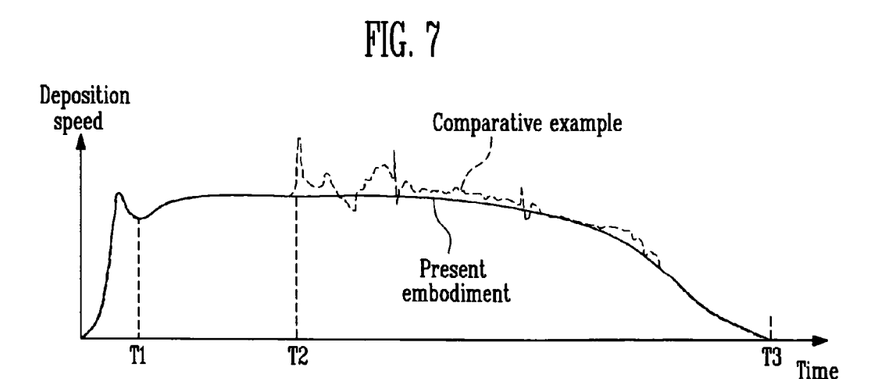
FIG. 7 is a graph showing evaporation rates of an evaporation source of the present invention and evaporation rates of an evaporation source of the comparative example.

FIG. 7 is a graph showing evaporation rates of an evaporation source of the present invention and evaporation rates of an evaporation source of the comparative example.

The evaporation source of the present embodiment is the apparatus of FIG. 1, and the evaporation source of the comparative example is the apparatus excluding the mesh member, the support and the thermally conductive balls from the apparatus of FIG. 1. As deposition material, melt deposition material not mixed with another thermally conductive balls is used. The melt deposition material means material whose state is changed from a solid to a gas via a liquid.

Referring to FIG. 7, the deposition speed of the crucible apparatus in the comparative example shows a relatively stable profile from a first time T1 that is deposition initiation, to a second time T2, and then shows an unstable profile after the second time T2. The reason is that since in the comparative example, the deposition material is splashed under an deposition process atmosphere at temperature of about 200° C. to 500° C. and portions of the deposition material are repeatedly fixed around the second opening portion of the cover, the second opening portion of the cover becomes smaller or is clogged.

However, the deposition speed of the present embodiment shows an expectable stable profile from a first time T1 that is deposition initiation, to a third time T3 that is deposition completion. As described above, with the evaporation source of the present embodiment, the opening portion on the upper side of the evaporation source is prevented from being clogged by the thermally conductive balls separated from the deposition material to be installed thereon and the mesh member supporting the thermally conductive balls, making it possible to secure stability of the deposition process.

Meanwhile, in the aforementioned embodiment, it has been described that another thermally conductive balls are not basically inserted into the deposition material. However, the present invention is not limited to the constitution as described above but another thermally conductive balls may be mixed with the deposition material, similarly to the case of the deposition material described in the comparative example of FIG. 3. In other words, if another thermally conductive balls are mixed with the deposition material, the capacity of the deposition material which can be held in the crucible becomes small. Therefore, considering only one time receiving capacity of the crucible, the deposition material mixed with another thermally conductive balls can be used, as needed.

When the deposition material mixed with another thermally conductive balls is used, it is possible to prevent the evaporation rates from being greatly changed by means of a bumping phenomenon or a falling phenomenon of material, etc., after the deposition material is first evaporated from the inner wall of the crucible during the deposition process. The bumping phenomenon means a phenomenon that a liquid does not boil even reaching its boiling point but abruptly boils by being impacted or added with foreign material, etc. after being heated over its boiling point. In other words, if another thermally conductive balls are mixed with the deposition material, the temperature uniformity of the deposition material is improved and the evaporation surface is almost constantly maintained so that the evaporation rates can be stabilized.

While the present invention has been described in connection with certain exemplary embodiments, it is to be understood that the invention is not limited to the disclosed embodiment, but, on the contrary, is intended to cover various modifications and equivalent arrangements included within the spirit and scope of the appended claims, and equivalents thereof.

What is claimed is:

1. An evaporation source, comprising:
   a crucible accommodating a deposition material and having an opening portion through which the deposition material passes;
   a mesh member installed in the opening portion of the crucible and having a plurality of holes; and
   thermally conductive balls disposed on the mesh member.

2. The evaporation source according to claim 1, wherein the diameter of the thermally conductive balls is in the range of 0.5 mm to 5.0 mm.

3. The evaporation source according to claim 2, wherein the thermally conductive balls comprise material having a melting point of 700° C. or more and having no outgasing at 500° C.

4. The evaporation source according to claim 3, wherein the thermally conductive balls comprises a SiC polymer.

5. The evaporation source according to claim 2, wherein each cell of the mesh member has a diameter smaller than the thermally conductive balls.

6. The evaporation source according to claim 5, wherein the mesh member comprises a barrier extending outwards along an inner wall of the crucible and holding the thermally conductive balls stacked in a multi-layer.

7. The evaporation source according to claim 5, wherein the mesh member comprises any one material of stainless steel, cooper and a combination thereof.

8. The evaporation source according to claim 1, further comprising:
   supporters supporting the mesh member in the inner wall on the upper side of the crucible, wherein the supporters are integrally provided with the mesh member and are separable together with the mesh member from the crucible.

9. The evaporation source according to claim 8, wherein the crucible comprises seating parts to which the supporters are coupled on the upper sides of the inner walls thereof.

10. The evaporation source according to claim 1, further comprising:
    supporters supporting the mesh member in the inner wall on the upper side of the crucible, wherein the supporters are integrally provided with the crucible and comprise protruding parts protruded from the inner wall of the crucible and contacting the mesh member.

11. The evaporation source according to claim 1, further comprising:
    a cover covering the mesh member and the thermally conductive balls, coupled to the crucible and having another opening portion.

12. The evaporation source according to claim 11, wherein the size of another opening portion is smaller than that of the opening portion of the crucible.

13. The evaporation source according to claim 1, wherein the deposition material comprises a meltable deposition material which is changed from a solid to a gas via a liquid.

14. The evaporation source according to claim 1, further comprising:
    another thermally conductive balls mixed with the deposition material to be inserted into an inner space of the crucible.

15. The evaporation source according to claim 1, wherein the crucible has a straight shape of which a lower side and an upper side of the inner space are the same in the cross-sectional area.

* * * * *